United States Patent

Dona

[11] Patent Number: 5,252,884
[45] Date of Patent: Oct. 12, 1993

[54] TRANSLATION DEVICE

[75] Inventor: Marinus J. J. Dona, Eindhoven, Netherlands

[73] Assignee: U.S. Philips Corp., New York, N.Y.

[21] Appl. No.: 875,904

[22] Filed: Apr. 28, 1992

[30] Foreign Application Priority Data

Apr. 29, 1991 [EP] European Pat. Off. ........ 91201023.8

[51] Int. Cl.$^5$ ...................... H01L 41/04; H01L 41/08; H01L 41/18
[52] U.S. Cl. ...................................... 310/328; 310/300
[58] Field of Search ................................. 310/328, 300

[56] References Cited

U.S. PATENT DOCUMENTS

| 3,135,207 | 6/1964 | Brown et al. | 310/300 X |
| 3,317,760 | 5/1967 | Coleman et al. | 310/300 |
| 3,889,086 | 6/1975 | Lucian | 310/300 X |
| 4,187,161 | 2/1980 | Fisher | 204/422 |
| 5,148,074 | 9/1992 | Fujita et al. | 310/328 X |
| 5,153,477 | 10/1992 | Jomura et al. | 310/328 X |

*Primary Examiner*—Emanuel T. Voeltz
*Assistant Examiner*—E. To
*Attorney, Agent, or Firm*—William L. Botjer

[57] ABSTRACT

The invention relates to a translation device comprising an actuator body and a coupling member which mechanically contacts said actuator body, the actuator body having at least one body of a solid electrolyte which is clamped between a pair of supporting surfaces and which is provided with at least one pair of electrodes between which mass transport takes place via the electrolyte under the influence of an electric potential difference, said mass transport causing the dimensions of the electrodes to change so that the coupling member is subject to a translation in a first coordination direction relative to a reference of the device. Preferably, AgI is used as the solid electrolyte and silver is used for the electrodes. On the basis of the above-mentioned principle, translation devices can be constructed for one, two or three-dimensional translations. Translations based on both translatory and rotatory motions are possible.

10 Claims, 4 Drawing Sheets

TRANSLATION DEVICE

BACKGROUND OF THE INVENTION

The invention relates to a translation device. The invention more particularly relates to a translation device enabling translations of a few nanometers to several tens of nanometers to be realised with a high degree of accuracy. Such translation devices are customarily based on micromechanical translation mechanisms. The devices are used, inter alia, in micromechanics and microelectronics.

A translation device of the type mentioned in the opening paragraph is known from, inter alia, European Patent Application EP-A 360.975. The device described therein is driven by means of an actuator body comprising a piezoelectric element. The accuracy of the translations effected with such devices is of the order of a few nanometers to several tens of nanometers (nms).

The known translation device has disadvantages. Thus, a relatively high electric voltage of the order of kVolts is required to effect translations with an actuator body driven by a piezoelectric element. Besides, in such translation devices said relatively high electric voltage across the piezoelectric element must be maintained in order to preserve an adjusted translation. If the electric voltage is removed the adjusted position is lost. A further disadvantage relates to the occurrence of hysteresis in piezoelectric elements. Due to this there is no unequivocal relation between the voltage applied across the piezoelectric element and the translation effected thereby. Consequently, additional facilities have to be provided to determine the translation obtained.

SUMMARY OF THE INVENTION

It is an object of the invention to provide, inter alia, a translation device in which the above disadvantages are avoided.

According to the invention, this object is achieved by means of a translation device comprising an actuator body and a coupling member which mechanically contacts the actuator body, said actuator body having at least one body of a solid electrolyte which is clamped between a pair of supporting surfaces and which comprises at least one pair of electrodes between which mass transport takes place via said electrolyte under the influence of an electric potential difference, said mass transport causing the dimensions of the electrodes to change so that the coupling member is subject to a translation in a first coordination direction relative to a reference of the device.

The invention is based on the insight that mass transport, which takes place in a solid electrolyte under the influence of an electric potential difference, can serve as the motor of a reliable translation mechanism in the actuator body of a translation device. Such a mass transport can be accomplished with only small potential differences, i.e. of the order of a few Volts. Said mass transport is directly proportional to the electric potential difference applied. The dimensions of the electrodes change as a result of mass transport between said electrodes. The volume of one electrode increases while the volume of the other electrode decreases.

It has been found that in the device according to the invention, the rate of translation and the range of the translation are governed by, inter alia, the electric potential difference applied, the material of which the body of solid electrolyte consists and the material of the electrodes. Further it has been found that the electric potential difference across the electrodes can be removed after a translation has been effected. The adjusted translation is preserved.

The coupling member of the translation device according to the invention is mechanically rigidly connected to the actuator body, for example, by means of bonding with an adhesive or clamping. The coupling member may be connected to both the body of the solid electrolyte and one of the electrodes. Preferably, the coupling member is secured, either directly or via a supporting plate, to the body of solid electrolyte. An electric potential difference applied across a pair of electrodes causes the coupling member to be subject to a translation relative to a reference of the translation device. The accuracy of said translation is of the order of a few nanometers. As no hysteresis occurs during mass transport in the solid electrolyte, the translation effected is unequivocally defined.

The body of solid electrolyte may be mechanically clamped between a pair of supporting surfaces of the translation device. Preferably, the body is fixed by means of spring members exerting a spring force. Thus, it is achieved that, even after a long period of use, the body of solid electrolyte is not exposed to impermissibly large mechanical forces. Without this measure, said forces could lead to fracture of the member. By virtue of the spring force the actuator body is clamped between the supporting surfaces of the translation device in a mechanically stable manner. The spring force can be generated in various ways. Thus, it is possible to provide spring members in the form of a layer of elastic synthetic resin between one of the electrodes of the pair of electrodes of the actuator body and one of the two supporting surfaces. Preferably, the spring force is generated by means of a coil spring or a leaf spring.

An embodiment of the translation device according to the invention is characterized in that the actuator body also comprises a second body of solid electrolyte having a second pair of electrodes and a second pair of supporting surfaces, enabling, in operation, a translation in a second coordination direction transversely to the first coordination direction, and in that the actuator body further comprises a third body of solid electrolyte having a third pair of electrodes and a third pair of supporting surfaces, enabling a translation in a third coordination direction transversely to the first and the second coordination directions.

The last-mentioned embodiment enables the coupling member to be three-dimensionally translated relative to a reference of the device. It is alternatively possible to manufacture a device for two-dimensional translations. In the latter case two pairs of electrodes are sufficient. Such a device may comprise two bodies of solid electrolyte which are each provided with one pair of electrodes. However, it is alternatively possible to use only one body of solid electrolyte having two pairs of electrodes.

A further embodiment of the translation device according to the invention is characterized in that at least one electrode of each pair of electrodes is plate-shaped and has three supporting studs resting on a substantially flat part of the body of solid electrolyte. It has been found that when the translation device is used for a long period of time the surface of the solid electrolyte becomes irregular. Since the electrode(s) is (are) provided with supporting studs which are clamped on the solid electrolyte by a spring force, the electric contact between the electrolyte and the electrode(s) remains satisfactory even after a long period of use of the translation device. Preferably, the supporting studs are positioned on the plate-shaped electrode in such a manner that they form the vertices of an imaginary, equilateral triangle. Due to said specific configuration, the position of the electrode(s) on the surface of the body of solid electrolyte is statically defined.

A still further embodiment of the translation device is characterized according to the invention in that the translation device comprises at least two, series-arranged, actuator bodies. By arranging a number of actuator bodies in series, it becomes possible to increase the translation range (stroke) of the translation device in accordance with the requirements.

The above-described embodiments of the translation device according to the invention are all based on translatory motions. It is also possible, however, to use the invention in translation devices based on rotatory motion. Such a translation device is characterized according to the invention in that the actuator body is rotatably arranged relative to a hinge point, which is situated outside the actuator body, via a rotatable arm which is mechanically connected to the actuator body.

In principle, all solid electrolytes having an electric conductance (p) of at least $10^{-6} \Omega^{-1}$ can be used in the translation device according to the invention. Metal salts of sulphur, selenium and tellurium can be used for this purpose. Suitable examples in this respect are $Ag_2Se$ and $Ag_2Te$. The solid electrolyte used, however, is preferably a halogenide. In particular silver halogenides such as $RbAg_3I_5$ are very suitable for use in the actuator body of the translation device of the present invention. Preferably, a simple, binary salt such as AgI is used as the solid electrolyte.

The electrodes of the actuator body should consist of a chemically inert, electrically conductive material, preferably a noble metal or a noble-metal alloy. Preferably, the electrode material consists of the same metal or the same metal alloy as that which is used as the metal salt in the solid electrolyte. This has a favourable effect on the mechanical and chemical stability of the actuator body. An actuator body containing a body of AgI as a solid electrolyte and comprising electrodes containing substantially exclusively silver was found to be optimally suitable for use in the translation device according to the present invention.

A further embodiment of the translation device according to the invention is characterized in that the solid electrolyte has a coating layer. The presence of such a coating layer has a favourable effect on the life of the solid electrolyte. Organic resins and, more particularly, impervious resins can be used as the material for such coating layers. This has a favourable effect on the life of, in particular, hygroscopic solid electrolytes such as, for example, AgI. Said coating layer has to be provided only on the parts of the solid electrolyte which do not comprise electrodes.

The invention will be explained in greater detail by means of the drawing, in which

Figure 1A:
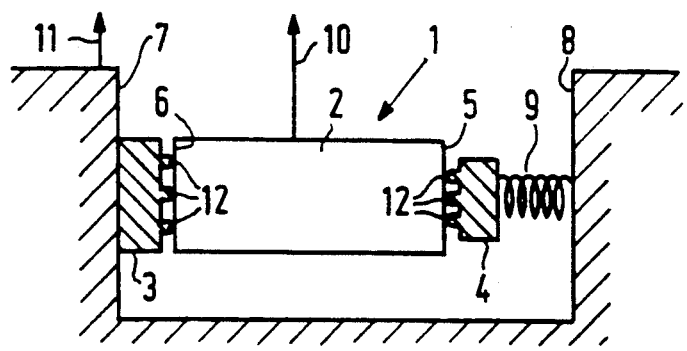
FIGS. 1a and 1b diagrammatically show a translation device according to the invention, by means of which one-dimensional translations can be effected, FIGS. 2a, 2b and 2c diagrammatically show a translation device according to the invention, by means of which two-dimensional translations can be effected.

It is noted, that for the sake of clarity the separate parts of the translation device shown are not drawn to scale.

DESCRIPTION OF THE PREFERRED EMBODIMENTS

Reference numeral 1 in FIG. 1 denotes an actuator body of the translation device according to the invention. Said actuator body comprises a block-shaped body 2, measuring $1.5 \times 1.5 \times 5$ mm$^3$, of a solid electrolyte on the basis of AgI which also contains 10% by weight of MgO. Said MgO promotes the electric conductance and the mechanical rigidity of the solid electrolyte. The actuator body 2 also comprises two electrodes 3, 4 of silver. Said electrodes are plate-shaped and are each provided with three supporting studs 12. The plate-shaped electrodes rest on substantially flat parts 5, 6 of body 2 via said supporting studs. Apart from the places of contact between the supporting studs and the body 2, the surface of body 2 is completely provided with a coating layer of an impervious resin (not shown). Electrode 3 is directly connected to supporting surface 7, for example by means of bonding with an adhesive. A coil spring 9 which is fixed under a spring force is situated between the electrode 4 and the supporting surface 8. The body 2 further comprises a diagrammatically shown coupling body (arrow 10) which is mechanically connected to said body 2 by clamping or bonding with an adhesive.

Figure 1B:
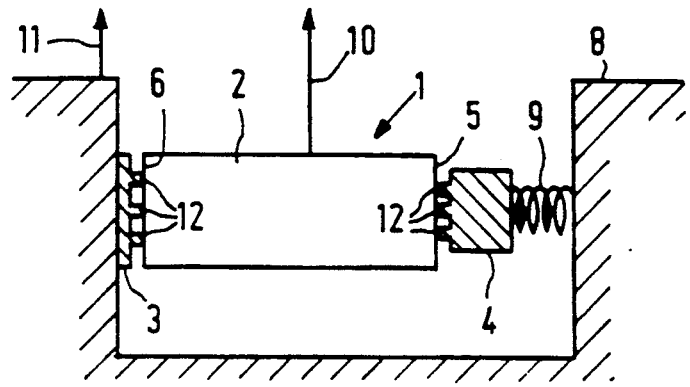

The pair of electrodes 3, 4 of the actuator body is electrically conductively connected to a DC voltage source (not shown) for generating an electric potential difference between the two electrodes. Mass transport takes place via the solid electrolyte under the influence of said potential difference. As a result thereof, the coupling body 10 is subject to a translation relative to a diagrammatically shown reference 11 of the device. FIG. 1a shows an initial situation, i.e. the situation before the voltage source was connected. FIG. 1b shows the situation obtained after an electric potential difference of approximately 1 Volt has been applied across the electrodes 3, 4 for some time. As a result of the mass transport via the electrolyte, electrode 3 has become thinner and electrode 4 has become thicker. Due to this, the coupling member 10 has been subject to a translation relative to reference 11. Under the above-described conditions, the measured translation was approximately 0.9 micrometer per minute. The accuracy of the translation was a few nanometers. After the electric potential difference across electrodes 3, 4 had been removed, no further translation of the coupling member 10 relative to the reference 11 was observed. The above-described embodiment of the translation device has only one degree of freedom. Consequently, only one-dimensional translations can be effected.

Figure 2A:
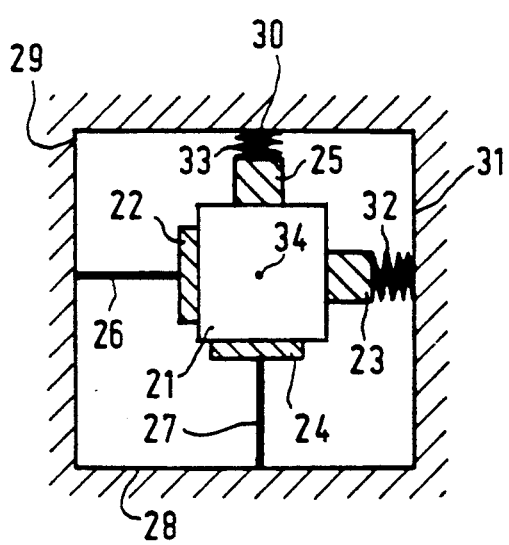

The translation device shown in FIG. 2 enables two-dimensional translations to be effected. The actuator body of said translation device comprises a cubical body 21 of solid electrolyte AgI. Body 21 comprises two pairs of electrodes 22, 23 and 24, 25, respectively, which are provided on two substantially parallel, oppositely located side faces of body 21. The electrodes of each pair of electrodes are electrically interconnected via a DC voltage source which is not shown. As in the above-described one-dimensional translation device, the electrodes comprise supporting studs (not shown) and a synthetic resin coating layer is provided on body 21. The electrodes 22 and 24 are connected to supporting surfaces 29 and 28, respectively, via leaf springs 26 and 27, respectively. The electrodes 23 and 25 are connected to the supporting surfaces 31 and 30, respectively, via coil springs 32 and 33, respectively. The coupling member 34 is mechanically connected to body 21.

Figure 2B:
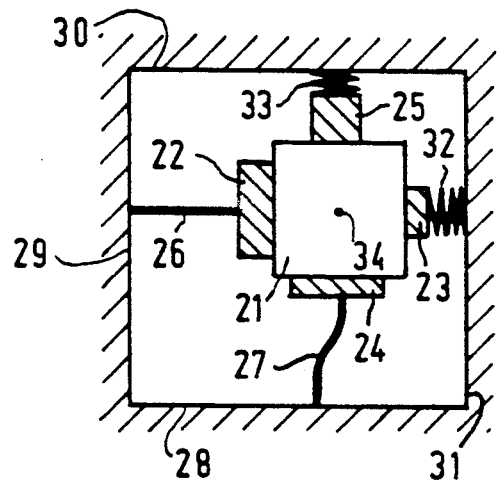
Figure 2C:
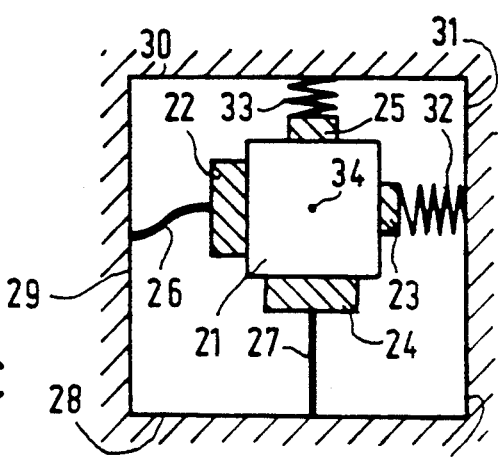

If an electric potential difference is applied only across the electrodes 22 and 23, the coupling member 34 is subject to a translation relative to a reference (not shown) of the translation device. On the basis of the situation shown in FIG. 2a, the situation as shown in FIG. 2b is attained after some time. If in a situation corresponding to that of FIG. 2a a potential difference is applied only across the electrodes 24 and 25, a situation as shown in FIG. 2c is attained after some time.

Figure 3A:
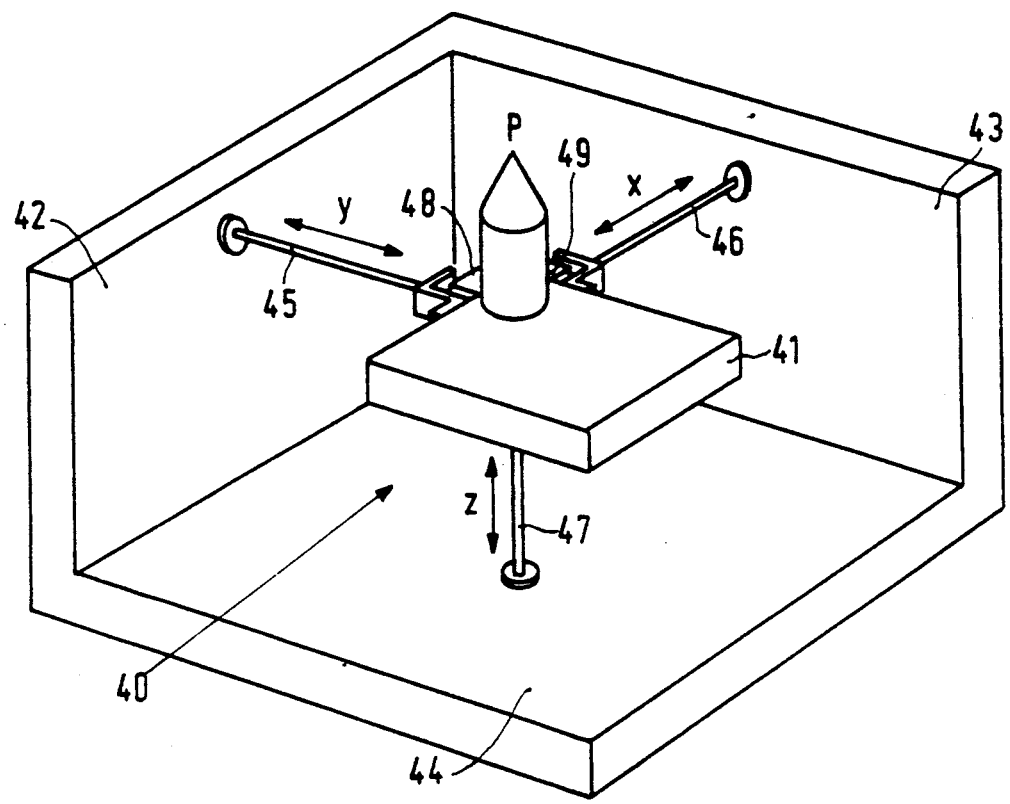
FIG. 3a is a perspective view of a translation device according to the invention, by means of which three-dimensional translations can be effected.

FIG. 3a is a perspective elevational view of a device according to the invention, by means of which three-dimensional translations can be effected. FIG. 3a shows an actuator body 40 comprising a supporting plate 41 of an electrically insulating material such as synthetic resin or ceramics. A coupling member P is attached to said supporting plate. At the sides 42, 43 and 44 of the device the supporting plate is connected to three metal spring rods 45, 46 and 47, respectively, which are each secured to a side of the supporting plate via a body of solid electrolyte 48, 49 and 50, respectively. FIG. 3a shows only two of said bodies which consist of AgI.

Figure 3B:
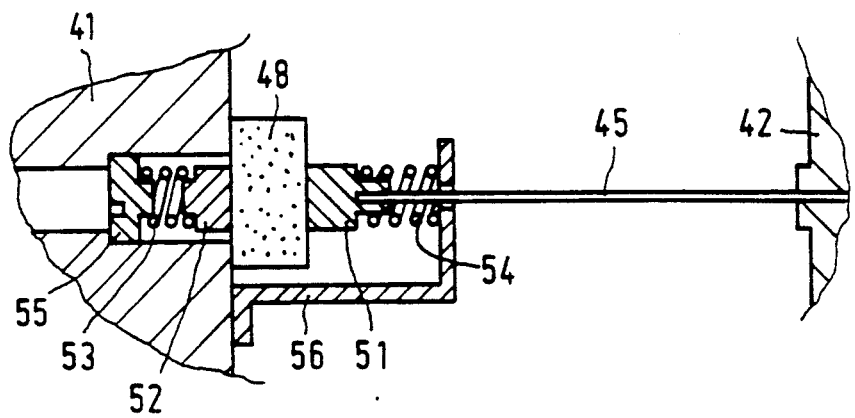
FIG. 3b is a sectional view that shows the attachment of the device of FIG. 3a to its supporting plate, FIGS. 4a, 4b and 4c diagrammatically show a different translation device according to the invention.

FIG. 3b is a sectional view of the place of attachment of the spring rod 45 to the supporting plate. The spring rod is connected to the solid electrolyte body 48 via the electrode 51 of Ag, the solid electrolyte body being bonded to the supporting plate 41 by means of an adhesive. The solid electrolyte body further comprises a second electrode 52 which is provided in an aperture in the supporting plate. The electrodes 51 and 52 are clamped to the body by means of the coil springs 54 and 53, respectively. Coil spring 53 rests with the end portion which faces away from electrode 52 against the supporting plate via set screw 55. Coil spring 54 rests with the end which faces away from electrode 51 against supporting part 56 which is mechanically rigidly connected to supporting plate 41. The spring rod is secured in such a manner that it coincides with the longitudinal axis of coil screw 54 and that it projects from an aperture in the supporting part 56. The electrodes of the pair of electrodes are electrically interconnected via a DC voltage source (not shown).

The application of a direct voltage causes the dimensions of the electrodes to change. As a result of the change in thickness of electrode 51, the supporting plate and, hence, the coupling member are translated in the y-direction (see FIG. 3a). As the supporting plate 41 comprises two further bodies of solid electrolyte, the coupling member can be subject to three-dimensional translations.

Figure 4A:
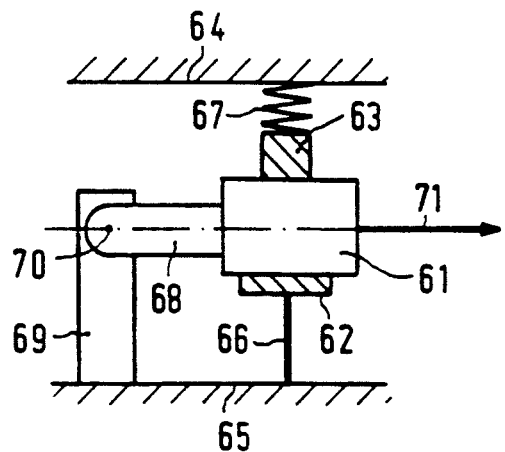
Figure 4B:
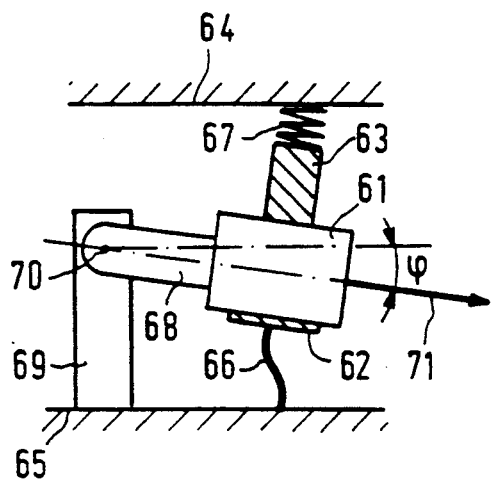
Figure 4C:
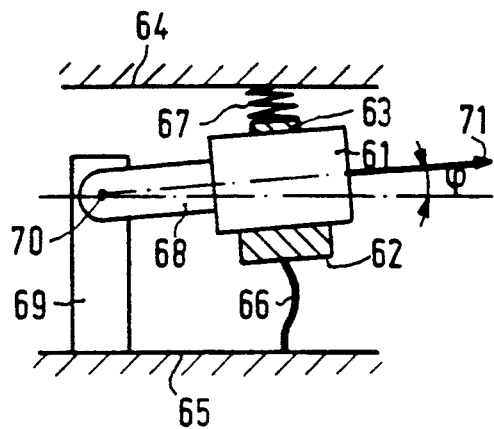

The above-described embodiments of the translation device according to the invention are all based on translatory motions. As has been noted above, the essence of the invention can also be used in translation devices based on rotatory motion(s). In FIG. 4 such a device is shown. The actuator body of said device comprises a body 61 of AgI on which a pair of silver electrodes 62, 63 is provided. Electrodes 62 and 63 are connected to supporting surfaces 65 and 64, respectively, via leaf spring 66 and coil spring 67, respectively. Body 61 further comprises a crossbar 68 which is rotatably connected to supporting bar 69 via hinge point 70. When an electric potential difference is applied between the electrodes 62 and 63, the mass transport via body 61 and the changes in the dimensions of the said electrodes will bring about a rotatary motion about the hinge 70. As a result of said rotatary motion the coupling member 71 which is connected to body 61 effects a rotatary motion relative to the supporting surfaces 64 and 65 through an angle. On the basis of the situation shown in FIG. 4a, the situation shown in FIG. 4b or 4c, depending on the direction of the potential difference, will be attained after some time. In the present embodiment of the invention, the actuator body is rotatably arranged relative to a hinge point, which is situated outside said actuator body, via a rotatable arm which is mechanically connected to said actuator body.

It is alternatively possible to construct a translation device according to the invention for two-dimensional translations, the translation device being based on a rotatory motion. This requires adaptation of the device shown in FIG. 4, for instead of one pair of electrodes two pairs must be secured to the body of solid electrolyte and the crossbar must be connected to the supporting bar via a ball joint. Such a device permits translations of the coupling member to be effected over a convex surface.

Figure 5:
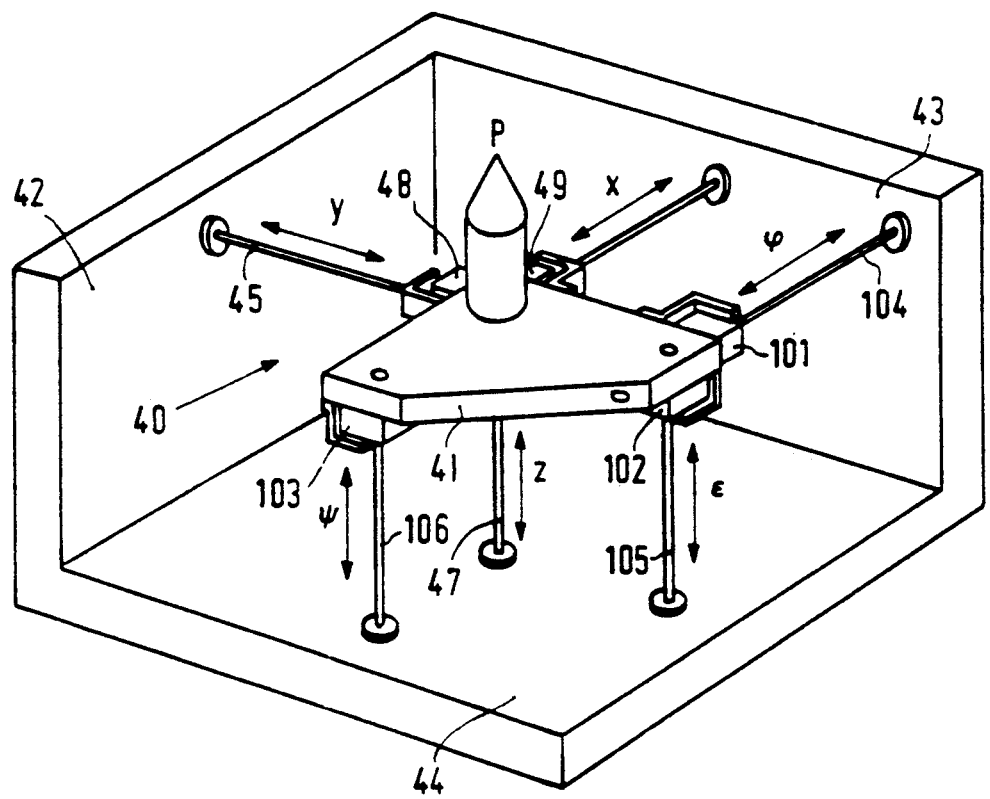
FIG. 5 is a perspective view of yet another translation device according to the invention.

FIG. 5 shows a device according to the invention, which enables translations based on both rotatory and translatory motions to be effected. Said device is derived from the device shown in FIG. 3 by means of which only translatory motions can be realized. Thus, corresponding parts bear the same reference numerals.

In addition to the bodies 48, 49 and 50 which are intended for translatory motion of the coupling member P, the device of FIG. 3 comprises three further bodies of solid electrolyte 101, 102 and 103. Said further bodies are attached to the supporting plate 41 in the same manner as the first-mentioned bodies. The bodies 101, 102 and 103 are connected to the side walls 43, 44 and 45, respectively, via the spring rods 104, 105 and 106, respectively. The depicted configuration of six bodies of solid electrolyte connected to supporting plate 41 enables the coupling member P to be translated along six independent degrees of freedom.

Figure 6:
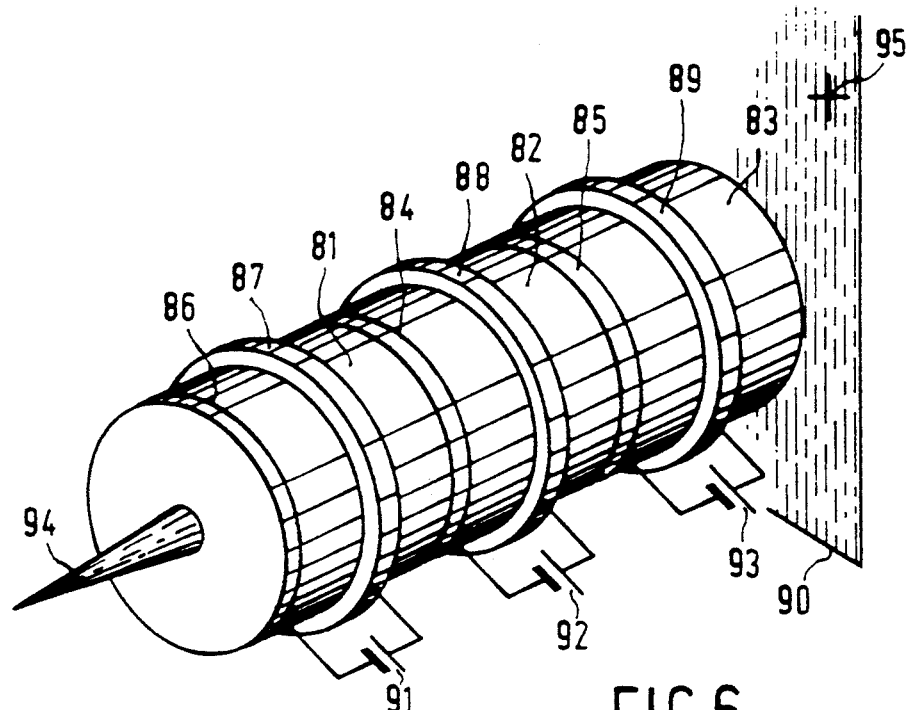
FIG. 6 is an elevational view of a translation device according to the invention comprising three, series-arranged, actuator bodies.

FIG. 6 shows a translation device comprising three, series arranged, actuator bodies. In said device, three cylindrical bodies 81, 82 and 83 of the electrolyte AgI are axially interconnected via the plate-shaped electrodes 84 and 85 of Ag. The cylindrical bodies comprise annular electrodes 87, 88 and 89. Body 83 is mechanically attached to the supporting wall 90 by means of clamping or bonding with an adhesive. Spring members (not shown) fixing the actuator bodies against the supporting wall 90 are provided on the side of electrode 86 facing away from the body 81. An electric potential difference can be applied to the pairs of electrodes 86, 87; 84, 88 and 85, 89 via the (diagrammatically shown) DC voltage sources 91, 92 and 93, respectively. Said potential difference causes the thickness of the electrodes 84, 85 and 86 to change. As a result thereof the coupling member 94 is translated relative to a reference 95 provided on the supporting wall 90.

I claim:

1. A translation device comprising an actuator body and a coupling member which mechanically contacts the actuator body, said actuator body having at least one body of a solid electrolyte which is disposed between a pair of supporting surfaces and which comprises at least one pair of electrode having dimensions between which mass transport takes place by said electrolyte when an electric potential difference is applied to said electrodes, said mass transport causing the dimensions of the electrodes to change so that the coupling member is subject to a translation in a first direction relative to a reference.

2. A translation device as claimed in claim 1, characterized in that the actuator body also comprises a second body of solid electrolyte having a second pair of electrodes and a second pair of supporting surfaces, enabling a translation in a second coordination direction transversely to the first coordination direction, and in that the actuator body further comprises a third body of solid electrolyte having a third pair of electrodes and a third pair of supporting surfaces, enabling a translation in a third coordination direction transversely to the first and the second coordination directions.

3. A translation device as claimed in claim 1, characterized in that at least one electrode of each pair of electrodes is plate-shaped and has three supporting studs resting on a substantially flat part of the body of solid electrolyte.

4. A translation device as claimed in claim 1, characterized in that the translation device comprises at least two, series-arranged, actuator bodies.

5. A translation device as claimed in claim 1, characterized in that the actuator body is rotatably arranged relative to a hinge point, which is situated outside the actuator body, via a rotatable arm which is mechanically connected to said actuator body.

6. A translation device as claimed in claim 1, characterized in that the solid electrolyte is a halogenide.

7. A translation device as claimed in claim 6, characterized in that the halogenide is a silver halogenide.

8. A translation device as claimed in claim 7, characterized in that the silver halogenide consists of silver iodide.

9. A translation device as claimed in claim 1, characterized in that the electrodes contain substantially exclusively silver.

10. A translation device as claimed in claim 1, characterized in that the solid electrolyte is provided with a coating layer.

* * * * *